United States Patent [19]

Liu

[11] 4,070,753
[45] Jan. 31, 1978

[54] AUTOMATIC INSERTION MACHINE FOR INSERTING RADIAL LEAD ELECTRONIC COMPONENTS

[76] Inventor: Clark Wen-Hai Liu, No. 25, Alley 8, Lane 18, T'ung-Ho Street, Taipei, Taiwan, China /Taiwan

[21] Appl. No.: 754,097

[22] Filed: Dec. 27, 1976

Related U.S. Application Data

[63] Continuation-in-part of Ser. No. 705,342, July 14, 1976.

[51] Int. Cl.² .............................................. H05K 3/30
[52] U.S. Cl. ........................................ 29/741; 29/742; 29/759; 29/809; 29/822
[58] Field of Search .................. 29/626, 711, 714, 739, 29/741, 742, 759, 809, 811, 816, 822

[56] References Cited

U.S. PATENT DOCUMENTS

| | | | |
|---|---|---|---|
| 3,608,175 | 9/1971 | Lambrecht | 29/741 X |
| 3,711,922 | 1/1973 | Busler et al. | 29/741 X |
| 3,722,062 | 3/1973 | Gharaibeh | 29/739 X |
| 3,893,232 | 7/1975 | Fletcher et al. | 29/741 X |

*Primary Examiner*—Carl E. Hall

[57] ABSTRACT

This invention relates to a high speed machine which can automatically insert radial lead electronic components onto the printed circuit board one-by-one. A combination of such machines installed at a work station can automatically insert many components onto one printed circuit board at the same time. In a similar way, the combination of such machines installed at many work stations can be arranged into a conveyorized assembly line which can automatically insert many components onto many printed circuit boards simultaneously. The apparatus and method for producing this result will significantly save labor in manufacturing electronic equipment.

5 Claims, 15 Drawing Figures

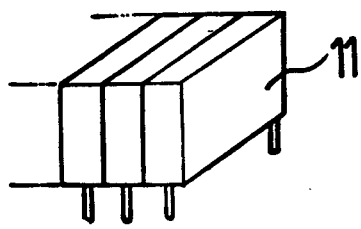
FIG. IA
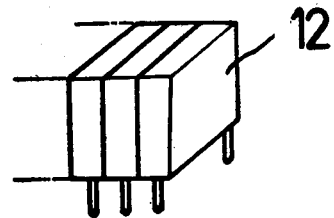
FIG. IB
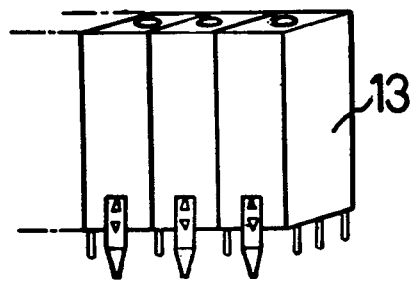
FIG. IC
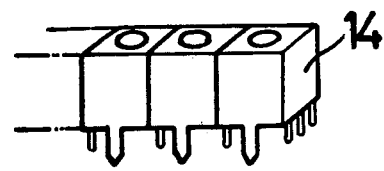
FIG. ID
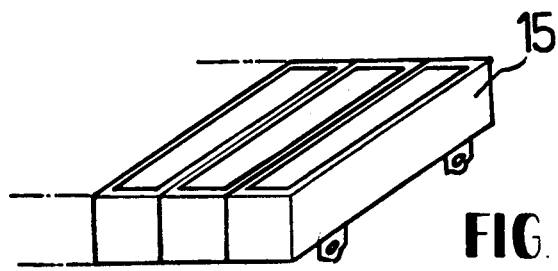
FIG. IE

AUTOMATIC INSERTION MACHINE FOR INSERTING RADIAL LEAD ELECTRONIC COMPONENTS

CROSS-REFERENCE TO RELATED APPLICATION

This application is a continuation-in-part of U.S. Pat. application Ser. No. 705,342, filed July 14, 1976.

BACKGROUND OF THE INVENTION

1. Field of the Invention

This invention relates to an automatic insertion machine and a combination of such machines for inserting radial lead electronic components.

2. Brief Description of the Prior Art

Due to rapidly increasing wages, the shortage of labor, and the attrition of labor in both developed and developing countries, together with hiring and training cost, the profitability of manufacturing electronic equipment such as TV, radio, phonographs, transceivers, etc. has been greatly reduced.

To overcome these problems, there has been conceived a new method and associated equipment developed to automatically insert axial lead type components onto printed circuit boards. However, this method requires a large investment for reel packing machines, sequence machines, and insertion machines and additional costs for reel packing the components. So far, only a few leading manufacturers can afford such machines.

Even so, the labor saving of automatically inserting axial lead components has been somewhat offset by the additional cost of requiring more room on the printed circuit board adapted to adopt this type of components.

Hence, the industry has desperately needed a new machine and method to be developed for automatically inserting radial lead components at a reasonable costs so that most manufacturers can afford it.

SUMMARY OF THE INVENTION

The automatic insertion machine according to the present invention comprises an insertion head, a feeding mechanism, frame, magnetic chuck and control system, which can automatically insert various kinds of radial lead electronic components onto the printed circuit board at high speed. The feeding mechanism has a bin big enough to accommodate enough components for several hours or even for a whole work shift. The magnetic chuck will simplify machine set up, alignment, and change-over.

In another aspect, this invention provides an application method combining several such machines at each work station for inserting many components onto one printed circuit board simultaneously. An in a further aspect, the multiplicity of these combinations at several work stations on a conveyorized assembling line will automatically insert many radial lead components onto many printed circuit boards at the same time. By such insertion machines and the application method, a significant number of labor hours on a printed circuit board assembling line can be saved, and both manufacturing productivity and product quality will be greatly improved.

BRIEF DESCRIPTION OF THE DRAWINGS

FIGS. 1a-1e are perspective views of examples of radial lead electronic components that are suitable for the automatic insertion method and machine, according to the present invention.

DESCRIPTION OF THE PREFERRED EMBODIMENT

The insertion machine according to the present invention is capable of handling radial lead components of uniform shape and size and which have two flat sides, such as molded capacitors 11, molded peaking coils 12, intermediate frequency transformers 13, 14, and wound power resistors 15 as shown in FIGS. 1a-1e.

Figure 2:
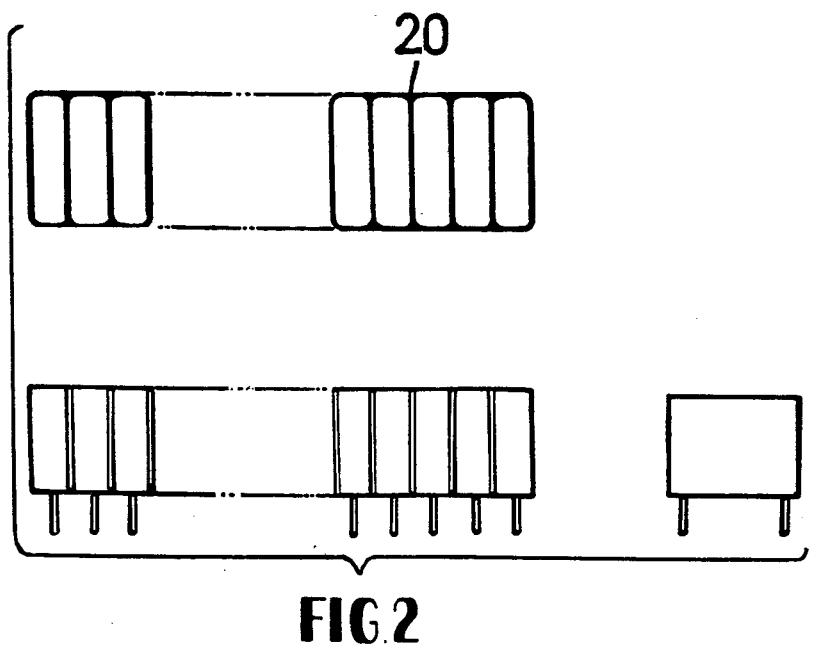
FIGS. 2a and 2b show the method of retaining radial leaded components by applying glue and cartridge.

Referring to FIGS. 2a with front, top and side views, the radial lead components are first stacked into a row 20 by hand or some simple mechanism, then a glue is applied at the lateral sides of the row (by brushing or dipping). As the glue drys, these components will be retained as a row and are very handy for processing, testing, inspecting, marking, counting, storing and transporting.

Figure 2B:
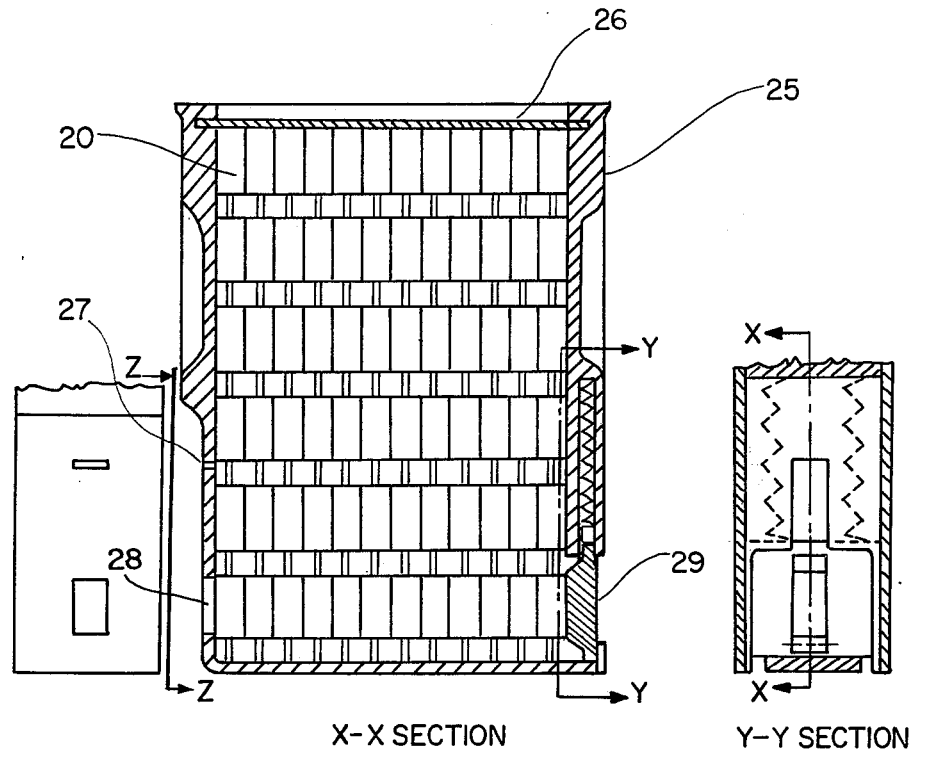

Referring to FIG. 2b, which shows the front, right side and left side views, many rows of components 20 are retained in a custom made cartridge 25 with a cover 26 on top. The cartridge 25 also has two openings 27 and 28 on left side, both being smaller than the size of component 16, and a gate 29 on the right side. With these, the cartridge is able to retain the components and be connected to the insertion machine, which will be illustrated later. The employment of this cartridge will provide great convenience in handling the components and save even more labor.

The insertion machine according to the present invention comprises an insertion head, a feeding mechanism, a storage bin, a supporting frame (not shown), a magnetic chuck (not shown), driving air cylinders (not shown) and a control system (not shown). Only the outstanding features of the insertion head, feeding mechanism, and storage bin will be fully illustrated, the remaining parts are of common knowledge and will be omitted from the description.

In order to make it easy to understand, the description will begin with the single machine operation without the employment of cartridge 25.

A. SINGLE MACHINE OPERATION

Figure 3E:
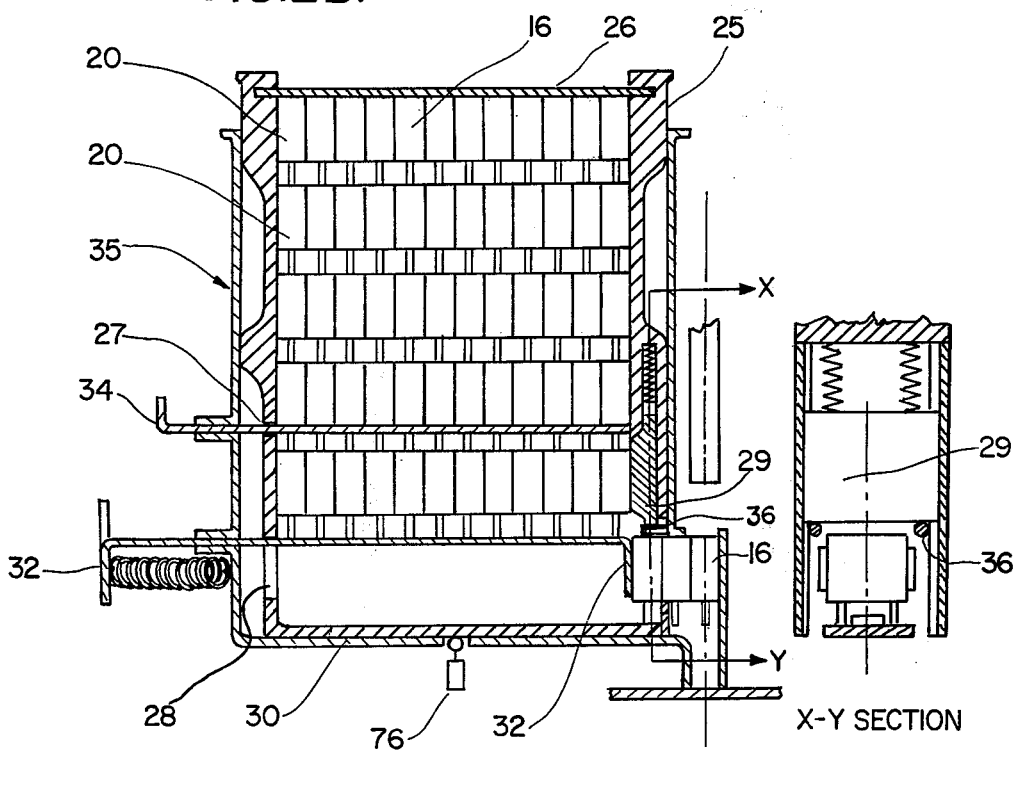
FIGS. 3a-3e show the operation procedure for a single insertion machine, according to the present invention.
Figure 3A:
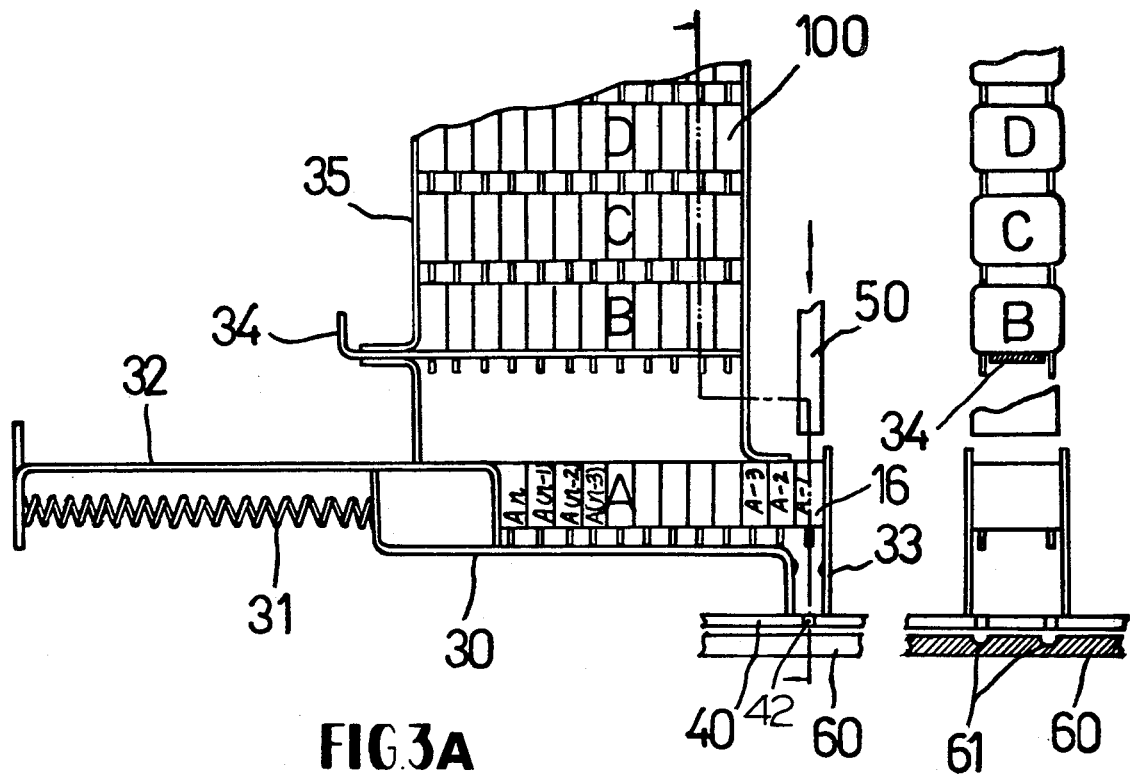

Referring to FIG. 3a, the whole row of components 16 are placed on the track 30 of the insertion machine.

The pushing rod 32, pulled by the extension spring 31, pushes against the back (left side) of the row A components. The guide 33 is aligned with the holes 42 of printed circuit board 40. With the leads of component A-1 aligned at the center line of the holes, the punch 50 which is driven by a pneumatic cylinder or an electric solenoid, will come down and push component A-1 onto the printed circuit board, i.e., the leads of components A-1 will be inserted into the holes. Then, the punch 50 moves upward, and the pushing rod 32 pushes row A components forward and places component A-2 beneath the punch 50. A new printed circuit board (or new holes) replaces the former. Punch 50 comes down and inserts component A-2. These p4rocedures will be repeated until all rows of components have been inserted onto printed circuit boards.

Figure 3B:
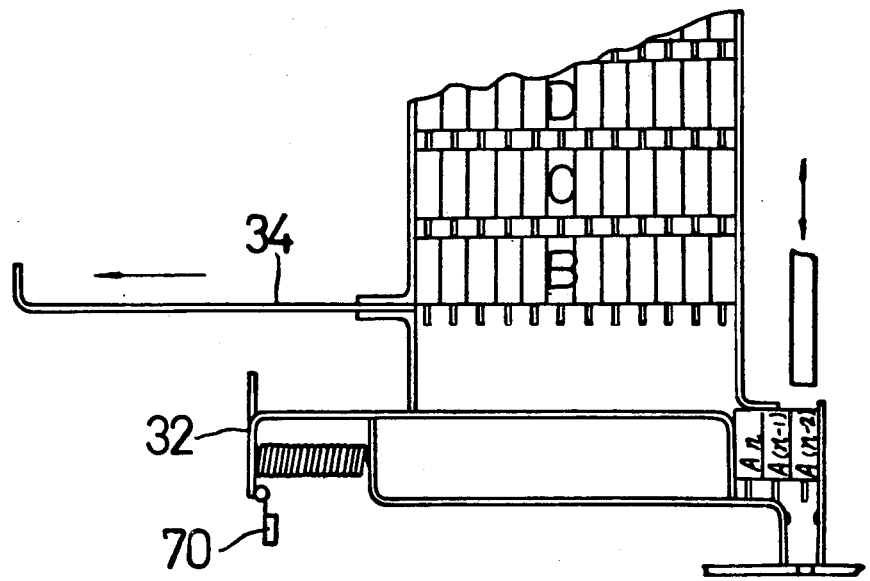
Figure 3C:
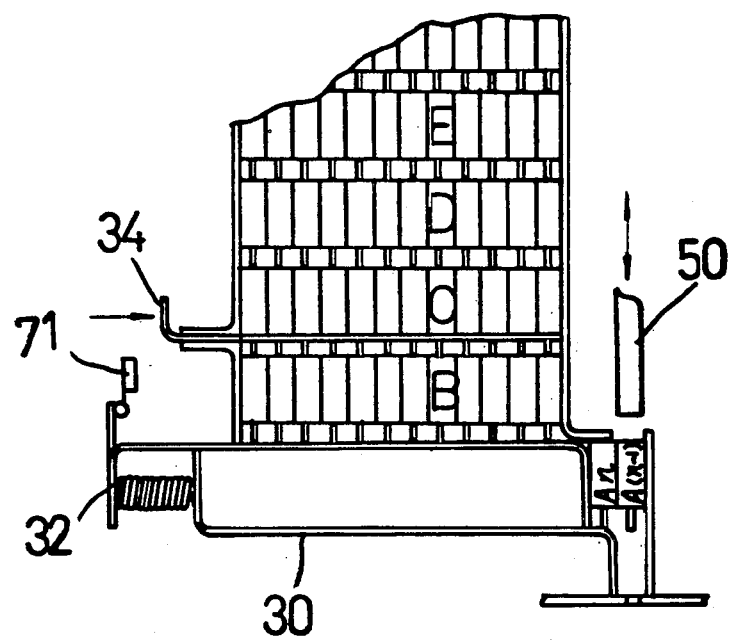

Referring to FIG. 3b, the pushing rod 32 moves forward as punch 50 is inserting components one by one. As soon as the component A (n-3) has been inserted, the pushing rod 32 moves ahead and hits the limit switch (such as a micro switch or photo cell) 70. By this signal, the control system immediately commands the driving cylinder (not shown) to pull supporting rod 34 all the way backwards, and components of rows B,C,D, etc. will fall down until row B stands atop of pushing rod 32. Then the supporting rod 34 immediately moves forward and in place beneath components row C as shown in FIG. 3c.

Figure 3D:
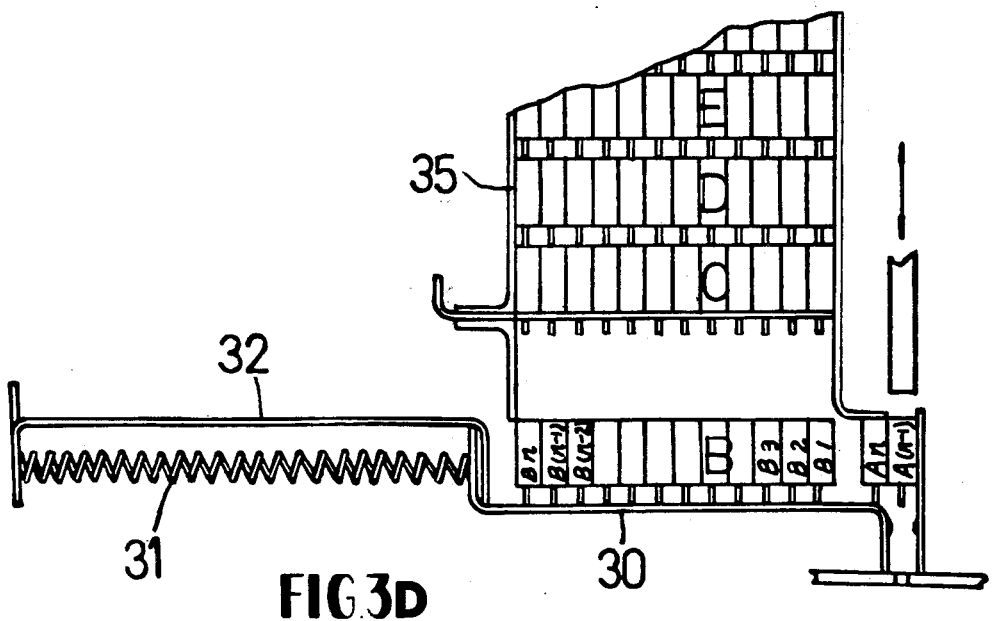

Continuing, punch 50 pushes down component A (n-2) and pushing rod 3 moves one more step ahead and hits the limit switch 71. Similarly, the control system commands the driving cylinder (not shown) to pull pushing rod 32 all way backward and let components row B fall down onto the track 30, as shown in FIG. 3d. The pushing rod 32 is immediately released from the driving cylinder and is again pulled forward by extension spring 31. It then presses against the back of component Bn with component B1 being forced against component An.

By these means, the machine can handle all components in the storage bin 35 one by one by repeating the above described procedures. The storage bin 35 may be constructed large enough to accommodate enough components for the whole shift work, so that no labor is needed to feed components during the shift. Alternatively, it may be large enough for a few hours work and one man could take care of several machines during the shift.

Referring to FIG. 3e, the cartridge 25 is employed to facilitate the refilling of storage bin. As the cartridge 25 is slid down into the storage bin 35 of the insertion machine, the gate 29 will be stopped by the stopper 36 which is connected to the insertion machine. Thus, when the cartridge reaches the bottom of storage bin 35, there will be an opening (at the gate 29) big enough to allow the component 16 to be pushed out of cartridge for insertion. The other two openings 27 and 28 on the left side of cartridge will allow supporting rod 34 and pushing rod 32 to move into the cartridge 25 for performing their functions. Additional limit switch 76 is also installed at the bottom of the storage bin (track 30), to assure the cartridge 25 has reached the low, closed end of the storage bin 35 before the machine operation starts. Besides, an alarm system (not shown) can be installed to signal whenever refilling is required. Thus, the insertion machine can perform the automatic insertion function either with or without the cartridge.

B. THE COMBINATION OF MACHINES AND THE APPLICATION METHOD

For assembling electronic equipments, it has been the conventional method that nuberous workers, sitting by both sides of a conventional assembling line, pick up components from the storage trays, and insert them one by one onto the printed circuit boards that are carried by the conveyor from station to station. The assembled printed circuit boards will finally go through the wave soldering machine for soldering the electric joints.

The key point of the method according to the present invention is to install many machines at each work station of the conveyorized assembling line to replace workers and precisely insert many components simultaneously on many printed circuit boards. This is a revolutionary method for the electronic industry.

The application method will be explained in detail as follows:

1. POSITION AND PILOT

Figure 4A:
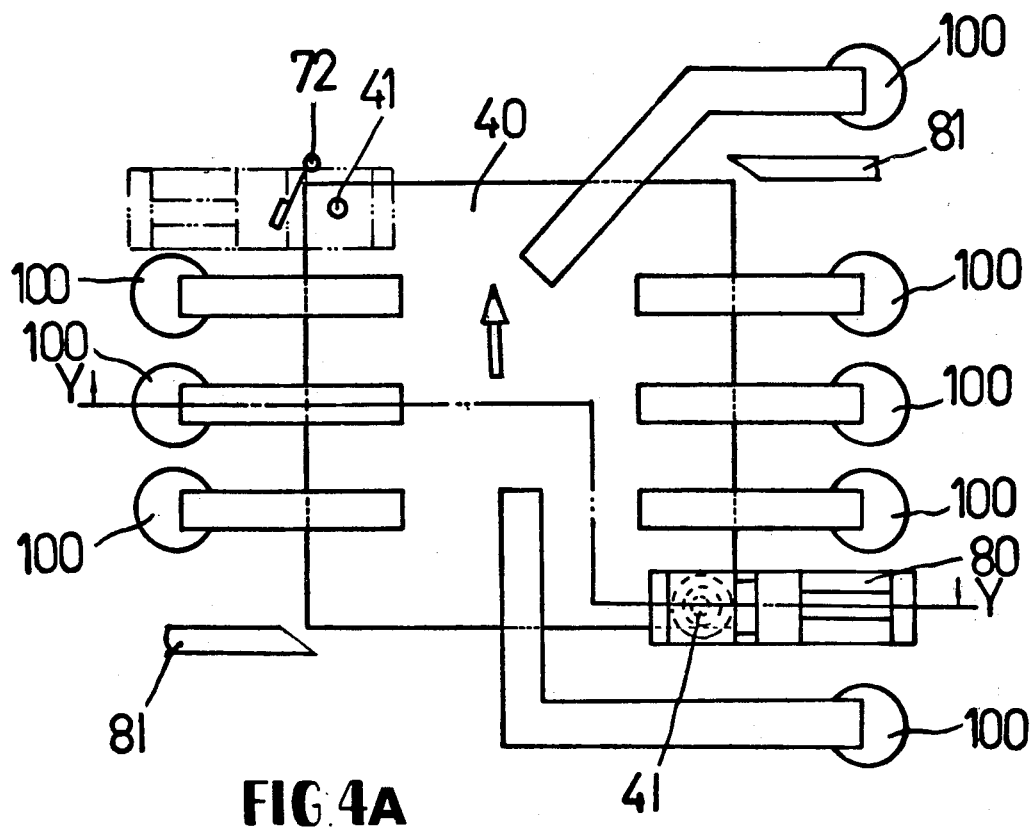
FIGS. 4a and 4b show the layout of a work station equipped with a combination of insertion machines at each work station.

Referring to FIG. 4a, the printed circuit board 40 carried by the conveyor will first hit the limit switch 72 as it arrives at the work station.

Figure 4B:
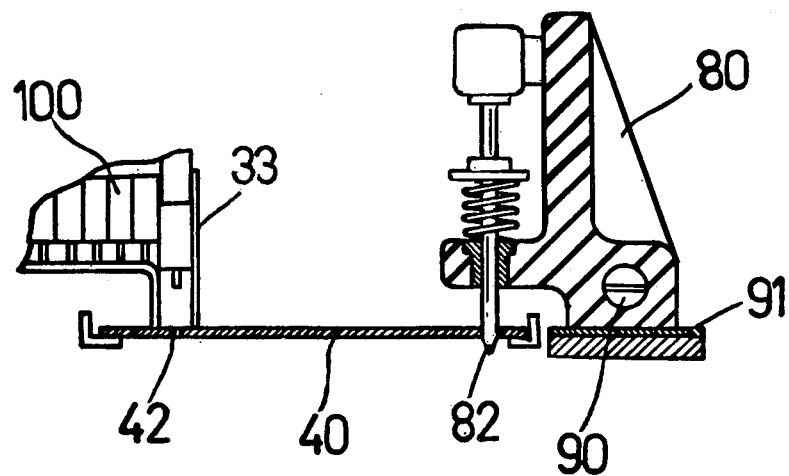

Upon receiving the signal from limit switch 72, the control system will command position slides 81, being driven by a pneumatic cylinder, to move forward. The inclined surfaces at the front ends of these positions slides 81 will relocate the printed circuit board and retain it at the exact position desired. Furthermore, the pilot pins 82 (FIG. 4b) of pilot mechanism 80 driven by a pneumatic cylinder, will come down and penetrate through the pilot holes 41 of printed circuit board 40. These procedures will assure placement of the printed circuit board at the exact location desired.

Both position slides 81 and pilot mechanism 80 are constructed with magnetic chucks 90 as the base. Thus, they can be easily fixed on a table covered with a steel plate. This will facilitate installation and alignment.

2. INSTALLATION AND ALIGNMENT OF INSERTION MACHINES

While the printed circuit board is positioned and piloted as described above, the guide 33 of each insertion machine 100 is prealigned to point at the holes 42 of printed circuit board 40 to insure proper repeated insertion of components. The machine is then fixed on the table by magnetic chuck 90 when a satisfactory insertion result is achieved. Thus, all insertion machines 100 at each work station will be installed and aligned accordingly as shown in FIG. 4a.

3. WHOLE LINE OPERATION

Figure 5:
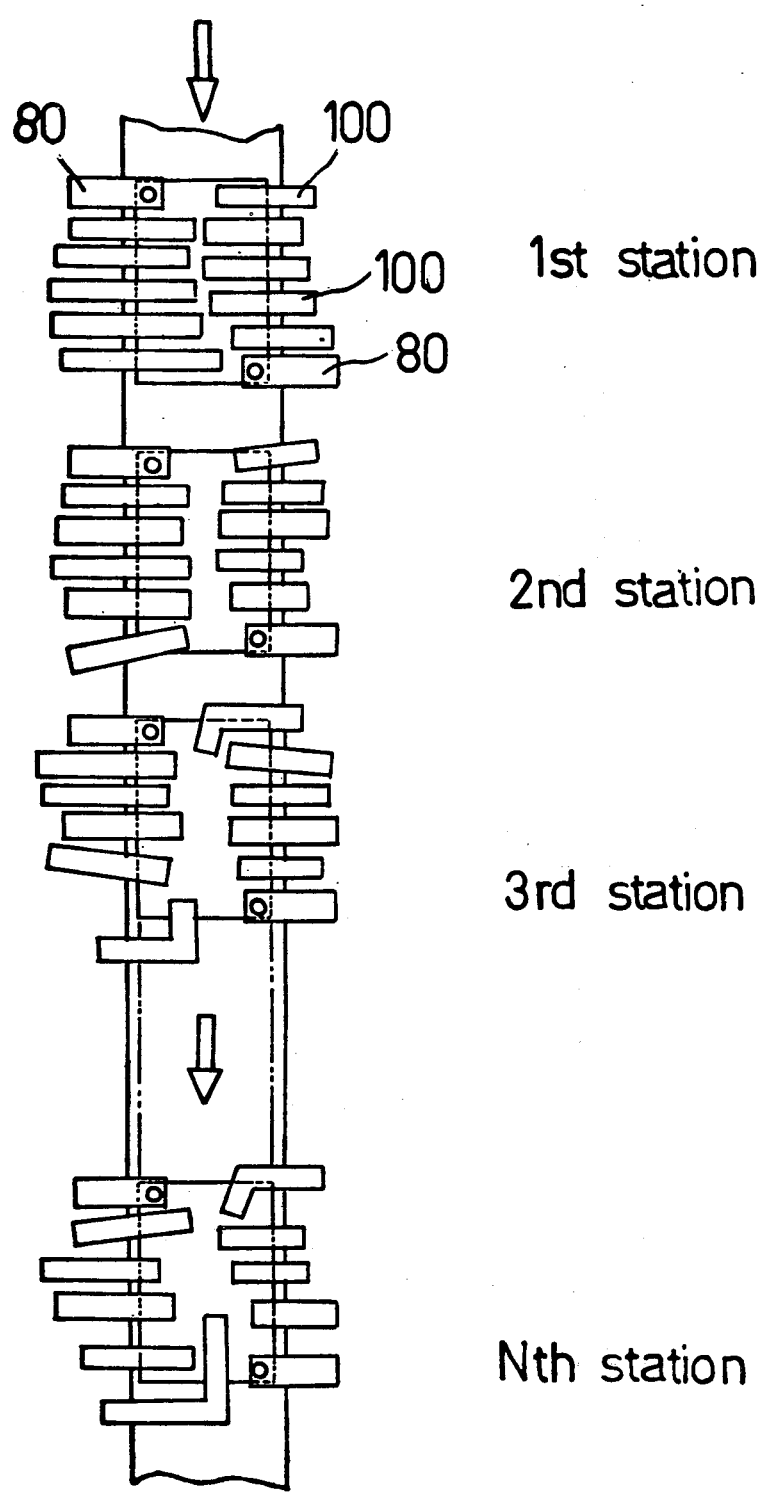
FIGS. 5 shows the layout of a conveyorized assembling line equipped with the combinations of the invented insertion machine at each work station.

Referring to FIG. 5, assuming ten insertion machines have been installed at every work station of a conveyorized assembly line, as soon as the first printed circuit board has arrived at the last station ($n^{th}$ station), the operator can insert $10 \times n$ components simultaneously in just a few seconds.

If the storage bins of the machines are large enough, no labor or very little labor is needed to take care of the feeding of components. This high speed and labor free insertion method may drastically change the electronic industry.

The outstanding features of this invention are as follows:

1. The feeding mechanism assures continuous and labor free operation.

2. The magnetic chuck of the machine facilitates the installation and alignment and allows a great degree of flexibility.

3. The compact and simple machine construction makes it possible to insert many components simultaneously on one printed circuit board. This increases the insertion speed.

4. The position and pilot mechanism makes it easy to convert a conventional assembly line to an automatic insertion one at very low cost.

In conclusion, it is a low cost, but highly flexible and high speed automatic insertion method and system.

I claim:

1. An automatic insertion machine which can automatically and continuously insert radial lead electronic components one by one onto a printed circuit board, said machine comprising:
   a. an insertion head for punching components onto a printed circuit board;
   b. means to retain electronic components in a plurality of rows;
   c. a feeding and advancing mechanism for advancing a first one of said rows toward said insertion head where an endmost component of the advanced row is inserted into said board and for feeding said rows of electronic components into alignment with the advancing mechanism such that all the components in a row are inserted into the board in sequence, and one row is used after another;
   d. a storage bin for supporting said feeding mechanism and storing said electronic components; and
   e. a magnetic chuck for fixing the machine to a work surface.

2. An automatic insertion machine according to claim 1 wherein said retaining means comprises a cartridge insertable in said storage bin, said cartridge holding a plurality of rows of components.

3. An automatic insertion machine according to claim 2, wherein said cartridge to retain the electronic components comprises:
   a closed case with a top covering for retaining electronic components therein;
   openings on a side wall of said case to allow the feeding mechanism to operate therein;
   a gate on a side wall of said case; and
   means for opening said gate when said cartridge is inserted in said storage bin.

4. An automatic insertion machine according to claim 1, wherein said feeding and advancing mechanism comprises:
   a track for guiding and supporting a first row of components;
   a pushing rod for pushing said first row of components along said track;
   an extension spring supplying the driving force for the pushing rod;
   a supporting rod for supporting additional rows of components above said first row on said track; and
   a set of limit switches controlling movement of the pushing rod and supporting rod.

5. Apparatus for inserting radial lead electronic components, each having two or more leads extending in one direction, into holes in printed circuit boards, said apparatus comprising:
   a cartridge retaining a plurality of rows of uniform size components, each of the components of one row being in side by side relation with their leads extending parallel and downward, the bottom end of the leads of one row being in contact with the components of the next lower row;
   an insertion guide for guiding individual components from said cartridge into preselected positions on said boards;
   a reciprocating means for pushing said individual components from said cartridge through said insertion guide;
   a track for guiding the components of a first row of components towards said reciprocating means;
   a feeding mechanism for feeding the components of said first row along said track; and
   for sequentially feeding further rows of components onto said track.

* * * * *